United States Patent
Taylor

[19]

[11] Patent Number: 5,923,179
[45] Date of Patent: Jul. 13, 1999

[54] THERMAL ENHANCING TEST/BURN IN SOCKET FOR C4 AND TAB PACKAGING

[75] Inventor: Scott A. Taylor, Phoenix, Ariz.

[73] Assignee: Intel Corporation, Santa Clara, Calif.

[21] Appl. No.: 08/625,628

[22] Filed: Mar. 29, 1996

[51] Int. Cl.⁶ .................................................. G01R 31/02
[52] U.S. Cl. .......................... 324/755; 324/758; 324/760
[58] Field of Search .................................. 324/755, 754, 324/758, 760; 439/66, 67, 68, 70, 71, 331

[56] References Cited

U.S. PATENT DOCUMENTS

| | | | |
|---|---|---|---|
| 4,268,102 | 5/1981 | Grabbe | 439/71 |
| 4,341,433 | 7/1982 | Cherian et al. | 439/71 |
| 4,396,935 | 8/1983 | Schuck | 439/331 |
| 4,554,505 | 11/1985 | Zachry | 324/755 |
| 4,597,617 | 7/1986 | Enochs | 439/66 |
| 5,057,904 | 10/1991 | Nagato et al. | 439/71 |
| 5,088,190 | 2/1992 | Malhi et al. | 324/755 |
| 5,123,850 | 6/1992 | Elder et al. | 439/67 |
| 5,127,837 | 7/1992 | Shah et al. | 439/71 |
| 5,247,250 | 9/1993 | Rios | 324/754 |
| 5,402,077 | 3/1995 | Agahdel et al. | 324/758 |

*Primary Examiner*—Ernest F. Karlsen
*Attorney, Agent, or Firm*—Blakely, Sokoloff, Taylor & Zafman

[57] ABSTRACT

A test socket used to test an integrated circuit that is mounted to a package or circuit board. The test socket includes a base that supports the integrated circuit and the circuit board. Pivotally connected to the socket's base are a pair of heat sinks that can be moved between a first position and a second position. When in the first position the heat sinks are pressed into either the package or integrated circuit to provide a direct conductive path between the integrated circuit die and the heat sinks. A plurality of test contacts are placed into contact with a plurality of surface pads located on the package to test the integrated circuit. The direct conductive path between the heat sinks and the die lowers the overall thermal impedance of the socket assembly and the junction temperatures of the integrated circuit during an electrical test routine of the circuit.

6 Claims, 1 Drawing Sheet

THERMAL ENHANCING TEST/BURN IN SOCKET FOR C4 AND TAB PACKAGING

BACKGROUND OF THE INVENTION

1. Field of the Invention

The present invention relates to a test socket used to electrically test integrated circuits (silicon die).

2. Description of Related Art

Integrated circuits are typically housed within a plastic or ceramic package that is soldered to a printed circuit board. The integrated circuit die is typically connected to the package by either bond wires, tape automated bonding (TAB), or C4 bumps. In C4/TAB packaging the integrated circuit (die) is bonded to the substrate or tape during package assembly.

The integrated circuit must be electrically tested before the package is assembled to a higher assembly. Packages are typically tested at a component level by placing the package into a test socket. Individual test contacts probe the package at the correct locations to test the assembled package. The integrated circuit generates heat during the test procedure. The heat must be removed to insure that the junction temperature of the integrated circuit does not exceed allowed maximum values. C4 and TAB packages are typically constructed from a material which have relatively poor coefficients of thermal conductivity. The high thermal impedance of these packages can be detrimental when testing an integrated circuit that produces a large amount of heat.

Additionally, these packages are typically placed into burn-in ovens to test the integrated circuit at elevated temperatures. The high thermal impedance of the packaging and the test socket create relatively high temperature differentials between the die and the oven. The high temperature differential lowers the accuracy of the test and limits the set point of the oven. It would be desirable to provide a test socket for an integrated circuit that is more thermally efficient than sockets of the prior art.

SUMMARY OF THE INVENTION

The present invention is a test socket used to electrically test an integrated circuit that is assembled in a package. The test socket includes a base that supports the integrated circuit and the package or circuit board. Pivotally connected to the base are a pair of heat sinks that can be moved between a first "closed" position and a second "open" position. When in the first position the heat sinks are pressed directly onto the integrated circuit or the package to provide an efficient conductive path between the integrated circuit die and the heat sinks. At the same time, a plurality of test contacts are placed into contact with a plurality of surface pads located on the package circuit board to test the integrated circuit. The direct conductive path between the heat sinks and the die lowers the overall thermal impedance of the socket assembly and the junction temperatures of the integrated circuit during an electrical test of the circuit.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
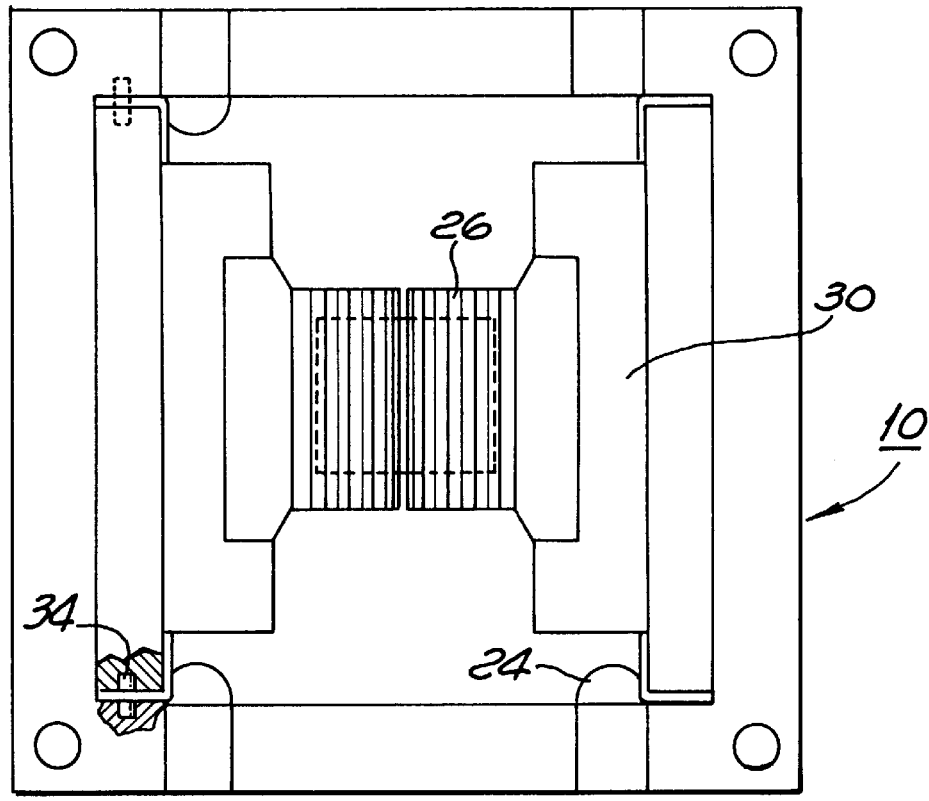
FIG. 1 is a side cross-sectional view of a test socket of the present invention.
Figure 2:
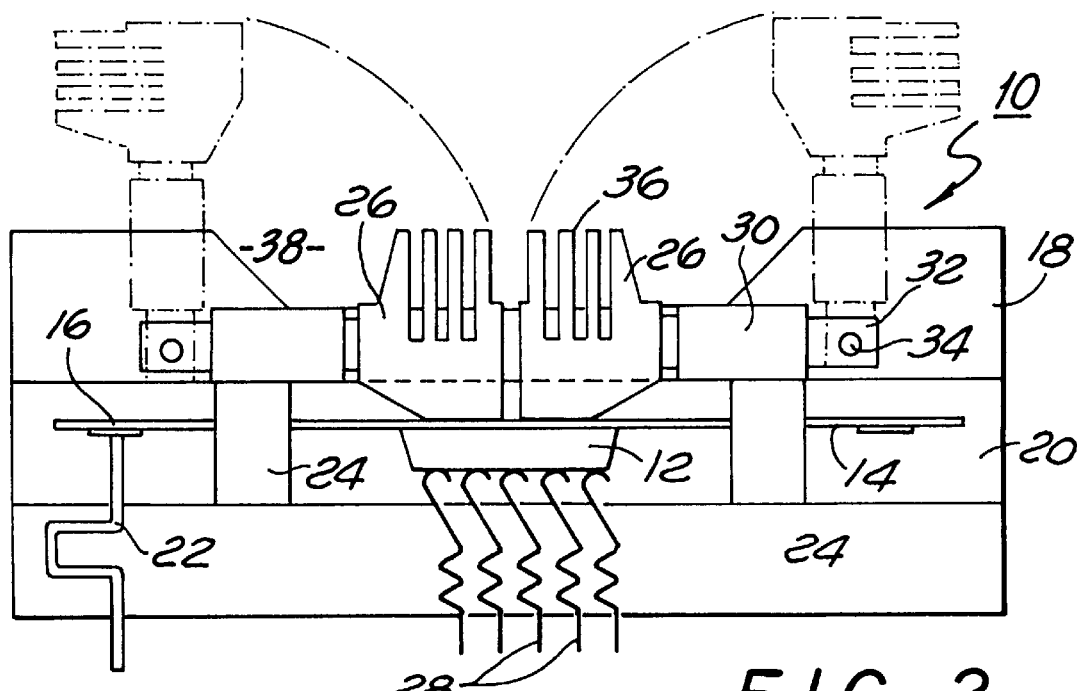
FIG. 2 is a top view of the test socket of FIG. 1.

Referring to the drawings more particularly by reference numbers, FIGS. 1 and 2 show a test socket 10 of the present invention. The test socket 10 is used to capture an integrated circuit 12 while the circuit 12 is being tested. The integrated circuit 12 is assembled to a package or circuit board 14. The circuit package/board 14 has a plurality of outer surface pads 16 that are electrically connected to the integrated circuit 12. The circuit package/board 14 may be a tape automated bonding (TAB) tape which typically has a plurality of etched copper traces and pads located on a dielectric polyimide tape. Alternatively, the circuit/package board 14 may be constructed as a rigid printed circuit board constructed with conventional laminated etched copper and glass filled dielectric layers. Such a package is typically referred to as a C4 flip chip package.

The test socket 10 includes a cover 18 that is attached to a socket base 20. The test socket 10 also contains a plurality of test contact pins 22 that come in contact with the surface pads 16 of the circuit board 14. The test contacts 22 are typically connected to an external electrical tester (not shown) which can then test the integrated circuit 12. The integrated circuit 12, circuit package/board 14 and socket 10 may also be placed into an oven (not shown) so that the circuit 12 can be tested at elevated temperatures.

The socket 10 contains alignment features 24 mounted to the socket base 20. The alignment features engage 24 with corresponding apertures in the circuit package/board 14 to align the package 14 within the socket 10 and allow the contacts 22 to be accurately placed on the surface pads 16.

The socket 10 has a pair of heat sinks 26 that are pivotally connected to the base 20. The heat sinks 26 can move between a first position and a second position. For TAB packaging, when in the first position the heat sinks 26 are pressed directly into contact with the package 14. The socket 10 may have a plurality of springs 28 that extend from the base 20 and push the integrated circuit 12 and package 14 into the heat sinks 26. When testing a C4 flip chip assembly the integrated circuit 12 and circuit board 14 are typically flipped within the socket 10 so that the top of the die 14 is in direct contact with the heat sinks 26. For a C4 test socket the contact pins 22 can also bias the integrated circuit 12 into the heat sinks 26.

The heat sinks 26 are held in place by a pair of latch arms 30. The latch arms 30 each have a pair of hinges 32. The hinges 32 are coupled to pins 34 that are mounted to the base 20. The latch arms 30 can be moved manually by grasping the heat sinks 26 and rotating the arms 30 to either the first or second positions. The latch arms 30 may also be connected via a cam mechanism (not shown) to the socket cover (18) which would drive the latch arms 30 to either first or second positions when the cover (18) is actuated downward toward the socket base (20). The latch arms 30 may have detents (not shown) or other features that secure the heat sinks 26 in either the first or second positions.

The heat sinks 26 provide a direct thermal conductive path to remove heat generated by the integrated circuit 14 while under test. The springs 28 press the circuit package/board 14 or die 12 into the heat sinks 26 to further reduce the thermal impedance between the integrated circuit 14 and the heat sinks 26. The heat sinks 26 typically have a plurality of fins 36 that increase the effective area and corresponding convective heat transfer rate between the heat sinks 26 and the ambient air. The cover 20 preferably has a cavity 38 that exposes the heat sinks 26 to the ambient to further improve the thermal efficiency of the socket 10. A flow of air is typically directed through the cavity 38 and across the heat sinks 26.

An integrated circuit 12 is tested by initially moving the heat sinks 26 to the second position and placing the integrated circuit 12 and circuit package/board 14 into the socket 10. The heat sinks 26 are then moved to the first position such that the springs 28 push the integrated circuit 12 and circuit package/board 14 into the heat sinks 26. The test contacts 22 are in contact with the surface pads 16 of the circuit package/board 14 so that the integrated circuit 12 is tested. When testing is completed, the heat sinks 26 are moved to the second position and integrated circuit 12 is removed from the socket 10 so that another device can be tested.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A test socket for an integrated circuit, comprising:

a base that supports the integrated circuit;

a pair of heat sinks that are coupled to said base to move between a first position and a second position, wherein said heat sinks are in contact with the integrated circuit in the first position and separated from the integrated circuit in the second position; and, a spring that biases the integrated circuit into said heat sinks when said heat sinks are in the first position.

2. The socket as recited in claim 1, wherein said heat sinks are pivotally connected to said base.

3. The socket as recited in claim 1, wherein said socket includes a cover that is coupled to said base.

4. The socket as recited in claim 3, wherein said cover has a cavity that exposes said heat sinks when said heat sinks are in the first position.

5. The socket as recited in claim 1, further comprising a plurality of test contacts that are coupled to the integrated circuit.

6. The socket as recited in claim 3, wherein said base has an alignment pin to align the package.

\* \* \* \* \*